(12) United States Patent
Murakami

(10) Patent No.: US 6,469,349 B2
(45) Date of Patent: Oct. 22, 2002

(54) SOI TYPE MOS ELEMENT AND MANUFACTURING METHOD THEREOF

(75) Inventor: Norio Murakami, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/865,475

(22) Filed: May 29, 2001

(65) Prior Publication Data

US 2002/0003260 A1 Jan. 10, 2002

(30) Foreign Application Priority Data

Jul. 4, 2000 (JP) ......................................... 2000-202224

(51) Int. Cl.[7] .......................... H01L 27/01; H01L 27/12; H01L 31/0392
(52) U.S. Cl. ........................ 257/347; 257/349; 257/373; 438/479; 438/517
(58) Field of Search ................................ 257/347, 349, 257/373; 438/479, 517

(56) References Cited

U.S. PATENT DOCUMENTS 6,025,629 A * 2/2000 Ipposhi et al. .............. 257/347
6,111,293 A * 8/2000 Liao ............................ 257/347

* cited by examiner

*Primary Examiner*—David Nelms
*Assistant Examiner*—Andy Huynh
(74) *Attorney, Agent, or Firm*—Venable; Norman N. Kunitz

(57) ABSTRACT

To present a SOI type MOS element excellent in yield, performance and characteristic, easy in manufacture, and low in cost, and a method of manufacturing the same. A SOI type MOS transistor structure comprising polysilicon electrodes 128 for gate, source and drain composed by burying into trench holes 120a, 120b, 120c respectively formed in a semiconductor substrate 110, a gate oxide film 122 formed in the entire inside of the trench hole 120a, N-diffusion layer 124 and N+ diffusion layer 126 formed in the entire inside of the trench holes 120b and 120c, and a thick $SiO_2$ film 114 in a trench hole 113 formed in the semiconductor substrate 110 so as to surround the transistor.

4 Claims, 6 Drawing Sheets

SOI TYPE MOS ELEMENT AND MANUFACTURING METHOD THEREOF

BACKGROUND OF THE INVENTION

1. Field of the Invention

The present invention relates to a semiconductor integrated element having a MOS transistor, structure, and more particularly to a SOI type MOS element and its manufacturing method.

2. Description of the Related Art

Along with enhancement of performance of semiconductor elements, nowadays, all electronic appliances and electronic systems are advanced rapidly. In particular, in the promoting trend of lower power consumption, higher speed, and smaller size of semiconductor elements, personal digital assistants represented by electronic pocketbooks and cellular phones are spreading fast and widely.

In the field of personal computers, too, the technical level is now nearly as high as allowing mobile use. Further, it may be soon possible in other electronic appliances hitherto regarded to be impossible in portable use. In the light of such market trend, it is today an indispensable subject to present semiconductor elements of high performance to the market.

At the present, the SOI (silicon on insulator) technology is proposed as a promising technology for achieving lower power consumption, higher speed, and smaller size, and it is intensively studied by semiconductor manufacturers.

According to this technology, an insulating layer composed of a silicon oxide (SiO) film is formed in the bulk near a semiconductor surface, and a semiconductor element is formed only on a thin surface layer of the semiconductor substrate being left over, and, therefore, the junction capacity of semiconductor element can be decreased and it is widely known that the power consumption and decline of speed can be suppressed.

FIG. 6 is a sectional view of an N channel MOS (metal oxide semiconductor) transistor 1 manufactured by the conventional SOI technology, and FIG. 7 is a plan of the N channel MOS transistor 1 manufactured by the conventional SOI technology.

As shown in FIG. 6 and FIG. 7, the N channel MOS transistor 1 comprises a P type silicon substrate 10, a P well layer 12, an oxide film 14 formed in silicon bulk near the surface of the silicon substrate 10, a filed oxide film 16, a gate oxide film 22, a source and drain N+ diffusion layer 26, a gate electrode 28, electrode contact holes 32, an aluminum electrode 34, a PSG film 40, and a passivation (PV) film 42.

In the semiconductor element manufactured by the conventional SOI technology, the oxide film 14 is formed in the silicon, and the transistor structure is formed only near the surface of the silicon substrate 10, and thereby the junction capacity is decreased and a higher performance is achieved.

Recently, methods commercially developed for forming the oxide film 14 include the SIMOX (separation by implanted oxygen) method and the adhesion SOI method., In the former method, oxygen ions are implanted at high dose in the bulk region near the surface of silicon substrate, and then the oxide film is formed and heat treatment is required for recovery of crystalinity.

In particular, to form a perfect buried oxide film 14 in the bulk, the oxygen ion implantation is performed at high energy and super-high dose of, for example, 200 keV, $2 \times 10^{18}/cm^2$. Further, in order to form the buried oxide film 14 in the silicon, it requires heat treatment at high temperature and for a long period of, for example, over 1300 degrees and 8 hours or more.

In the latter method, a heat oxide film is formed on one or both of two substrates, and they are adhered together, and one of them is polished to form into a thin film to compose a SOI structure. Therefore, as compared with the ordinary silicon substrate, the manufacturing process is complicated.

Thus, the conventional SOI technology involves the following problems. First, crystal defects occurring when forming the oxide film 14 have adverse effects on reliability, yield, quality and characteristics of the produced MOS device, and the original performance of the element cannot be exhibited sufficiently. At the present, it is difficult to obtain stable crystal quality.

Second, in the SIMOX method which requires oxygen ion implantation equipment of high dose and heat treatment equipment of high temperature at the time of manufacture, development of such equipment suited to mass production is indispensable.

Third, the SOI substrates are generally supplied by silicon wafer makers, but the cost is high as compared with other silicon substrates because of such special technology required as mentioned above.

Fourth, the structure itself of the conventional SOI type MOS element is a simple structure having a general structure of a conventional MOS transistor formed on the SOI substrate, and hence the performance of the element is not sufficiently improved, and further structural ideas and improvement of characteristics are demanded.

The invention is devised in the light of these problems of the conventional SOI type MOS element and its manufacturing method, and it is hence an object thereof to present a SOI type MOS element which is excellent in yield, performance and characteristics, easy in manufacturing method, and low in cost, and a method of manufacturing the same.

SUMMARY OF THE INVENTION

To solve the problems, the invention presents a SOI type MOS element having a MOS transistor structure comprising gate, source and drain electrodes buried in first, second and third trench holes formed in a semiconductor substrate, a thick $SiO_2$ film in a fourth trench hole formed in the semiconductor substrate for surrounding the transistor, and a channel region formed in the semiconductor substrate along the first trench hole.

Further, the SOI type MOS element has an intermediate insulating layer, contact holes, a wiring electrode, and a passivation layer.

The SOI type MOS element is manufactured in a method comprising a step of preparing a P type or N type semiconductor substrate, a step of forming a fourth trench hole around a region for forming a MOS transistor in the semiconductor substrate, a step of burying an $SiO_2$ in the fourth trench hole, a step of forming first, second and third trench holes in a region surrounding by the $SiO_2$, a step of forming a gate oxide film on the entire surface of the inside of the first trench hole, a step of forming an N type impurity layer on the entire surface of the inside of the second and third trench holes, and a step of burying a conductive polysilicon film in the first, second and third trench holes to form as gate, source and drain electrodes, respectively.

It also includes a step of forming an intermediate insulating layer, contact holes, a wiring electrode, and a passivation layer.

According to this structure, it does not require oxygen ion implantation technology of high dose and high energy or heat treatment at high temperature and for a long time, and it is possible to manufacture a SOI type MOS element having a completely new SOI structure different from the conventional SOI structure, excellent in crystallinity, low in power consumption, high in speed, and smaller in size, and excellent in reliability and other performances.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Figure 1:
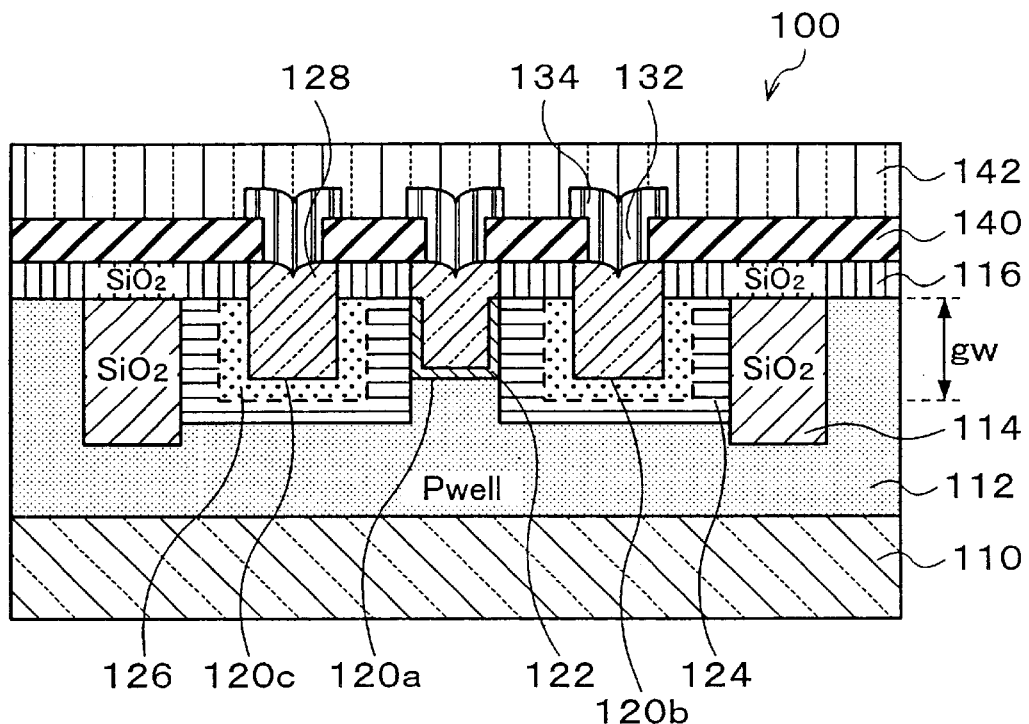
FIG. 1 is a sectional view of trench type N channel MOS transistor 100 of SOI structure according to an embodiment of the invention.

Referring now to the accompanying drawings, preferred embodiments of the SOI type MOS element of the invention and its manufacturing method are described below. In the description and drawings, same constituent elements substantially composing same functions are identified with same reference numerals, and duplicate explanation is omitted.

Figure 2:
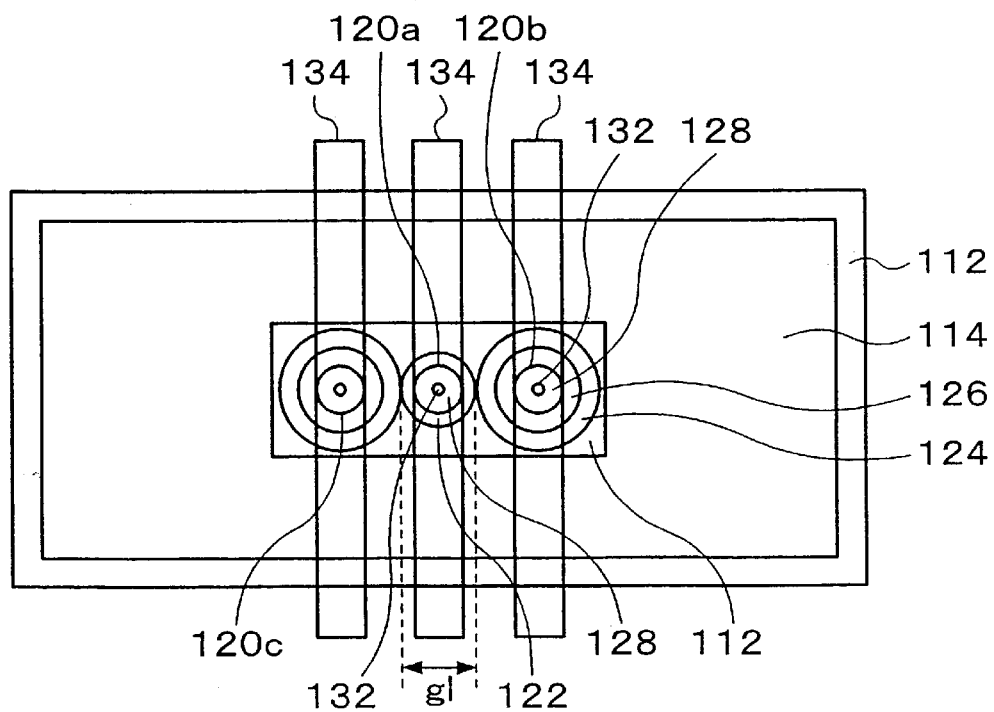
FIG. 2 is a plan of trench type N channel MOS transistor 100 of SOI structure according to the embodiment.

FIG. 1 is a sectional view of trench type N channel MOS transistor 100 of SOI structure according to an embodiment of the invention, and FIG. 2 is a plan of trench type N channel MOS transistor 100 of SOI structure according to the embodiment. FIG. 3 and FIG. 4 are diagrams showing a manufacturing method of trench type N channel MOS transistor 100 of SOI structure. FIG. 5 is a diagram showing the current flowing direction of trench type N channel MOS transistor 100 of SOI structure.

As shown in FIG. 1 and FIG. 2, the full trench N channel MOS (FT-MOS) transistor 100 of SOI structure according to the embodiment comprises a P type or N type semiconductor substrate 110, a P well layer 112, an $SiO_2$ film 114, a field oxide film 116, trench holes 120a, 120b, and 120c for buried gate, source, and drain electrodes, a gate oxide film 122, a source and drain N-diffusion layer=124, a source and drain N+ diffusion layer 126, a polysilicon electrode 128 buried in gate, source, and drain trench holes, contact holes 132 for gate, source, and drain, an aluminum electrode 134, an intermediate insulating film 140, and a passivation (PV) film 142. Herein, the gate width is gw, and the gate length is gl.

The semiconductor substrate 110 is, for example, an N type silicon substrate. The field oxide film 116 is made of, for example, $SiO_2$, but $Si_3N_4$ or the like may be also used because it is a mask material for silicon etching.

The polysilicon electrode 128 is made of polysilicon doped with impurities. The intermediate insulating film 140 is for insulation from the wiring, and a PSG film is used.

Figure 3A:
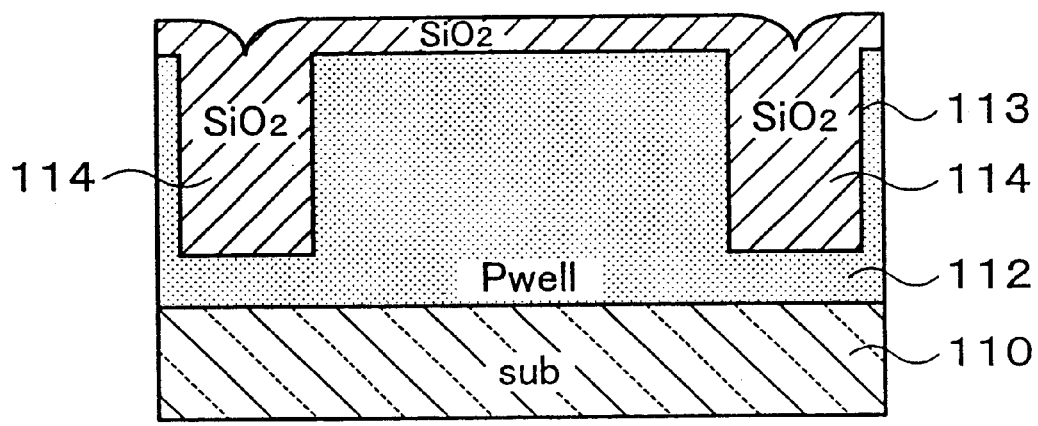
FIG. 3 is a diagram showing a manufacturing method of trench type N channel MOS transistor 100 of SOI structure according to the embodiment.

The manufacturing method is explained below by referring to FIG. 3 and FIG. 4. As shown in FIG. 3(a), first, a semiconductor substrate 110 of, for example, N type of about 20 to 50 ohm·cm is prepared. Next, to form an N channel MOS element, a P well layer 112 is formed by ion implantation and heat diffusion method, for example, at concentration of $1 \times 10^{13}$ to $1 \times 10^{14}$ $cm^2$, and depth of 5 to 10 $\mu$m. When forming this P well layer 112, it is preferred to implant ions at high energy (for example, about 1 to 3 MeV) in order to control the impurity concentration uniformly at a desired depth.

At a specified depth (for example, about 7 $\mu$m) from the substrate surface, a trench hole 113 is formed. To form the trench hole 113, a mask material for etching such as $SiO_2$ is prepared on the substrate surface, and silicon etching is performed by using it as the mask. Silicon etching is easily achieved by an existing plasma dry etching method.

After forming the trench hole 113, the trench hole 113 is filled up with $SiO_2$ film. Accordingly, the $SiO_2$ film is formed by heat oxidation on the semiconductor surface and the entire inside of the trench hole 113.

The film thickness at this time depends on the width of the trench hole 113, and, for example, at a trench hole width of about 2 $\mu$m, an $SiO_2$ film of about 1 $\mu$m is formed. It is herein important for the sake of characteristic to bury the trench hole 113 with a insulating film of a low dielectric constant as far as possible.

Or, in consideration of risk of parasitic leak in the trench hole 113, it is effective to dope the trench hole 113 preliminarily with boron or other element for preventing inversion of parasitic MOS. At this time, the concentration of boron is about $1 \times 10^{18}/cm^3$.

Afterwards, leaving the $SiO_2$ film 114 in the trench hole 113, the $SiO_2$ film on the silicon surface is completely removed. It can be removed by etch-back method by plasma dry etching. However, this etch-back process is not essentially needed, and maybe omitted. In the embodiment, this removing step is incorporated in order to achieve a sufficient flatness of the substrate surface.

Figure 3B:
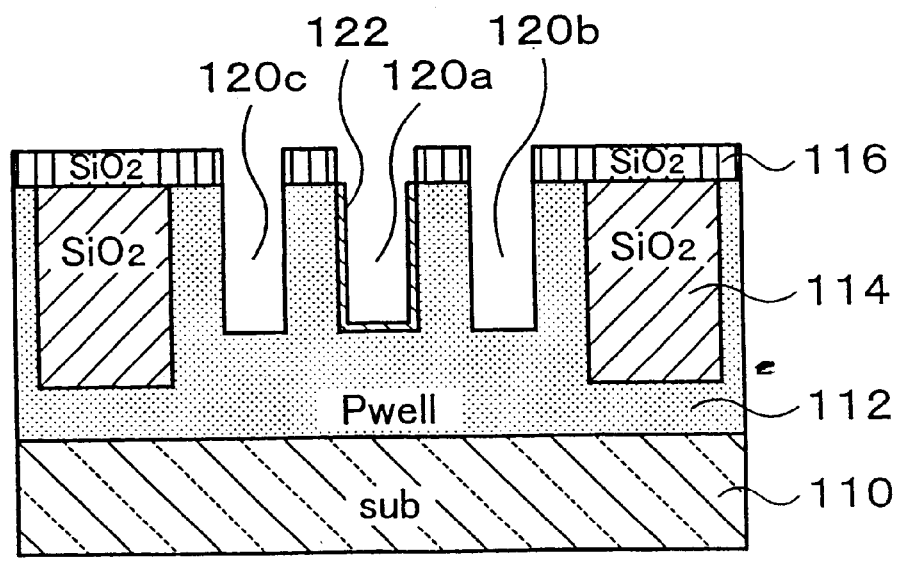

The process goes to FIG. 3(b). First, on the entire silicon surface, an $SiO_2$ film is formed in a thickness of, for example, 20 to 50 nm by heat oxidation. Further thereon, an $SiO_2$ field oxide film 116 is formed in a thickness of, for example, 0.5 to 1.0 $\mu$m by CVD method.

By photolithography and silicon dry etching, using the field oxide film 116 as mask, trench holes 120a, 120b, and 120c are formed for forming gate, source, and drain electrodes of the FT-MOS transistor. The trench holes 120a, 120b, and 120c are formed in a depth of about 3 to 6 $\mu$m at a diameter of, for example, about 1 $\mu$m.

Figure 3C:
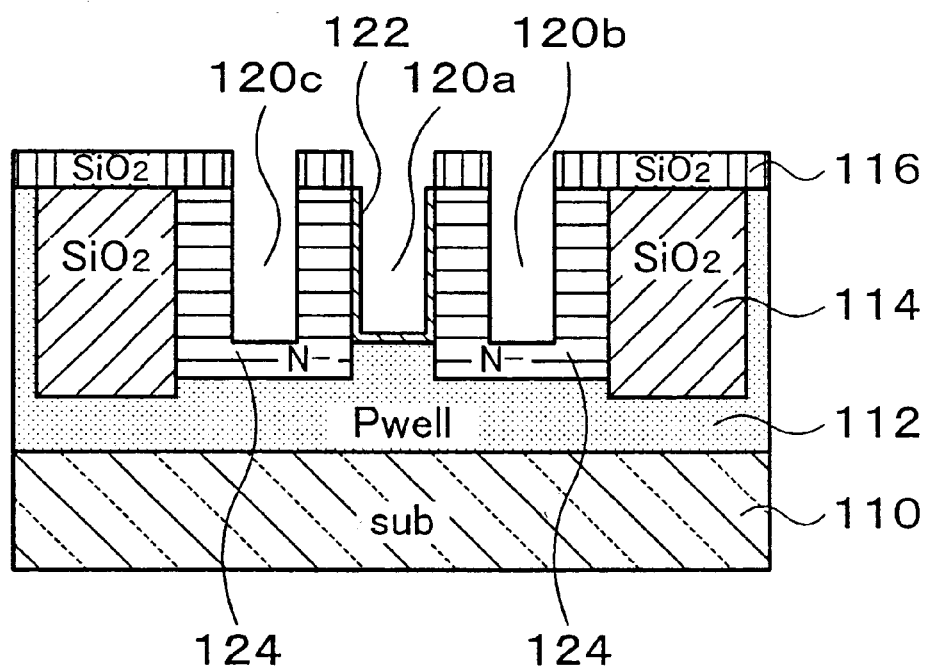

The process goes to FIG. 3(c). An oxide film 122 is formed in the gate trench hole 120a. First, on the entire surface of the substrate, an oxide film of 5 nm to 20 nm is formed by heat oxidation method, and then the oxide film is removed except for the area of the gate trench hole 120a by photolithography and etching method, thereby forming a gate oxide film 122. As the etching method, the wet process by hydrofluoric acid may be used.

Besides, in consideration of risk of parasitic channel occurring in the bottom of the gate trench hole 120a, it is effective to implant boron ions preliminarily in the bottom of the trench hole 120a. The amount of implantation is, for example, about $1 \times 10^{13}/cm^2$.

Consequently, an N-diffusion layer 124 is formed in the source and drain trench holes 120b and 120c by ion implantation method. The concentration is, for example, $1 \times 10^{12}$ to $1 \times 10^{14}/cm^2$. Of course, the other regions than the area of the source and drain trench holes 120b and 120c are covered with mask of photo resist or the like.

At this time, in order to implant ions uniformly around the trench holes 120b and 120c, an oblique implantation method is employed, which is a known art. Or, by rotary implantation method of implanting while rotating the substrate, more uniform implantation is possible.

The depth of N-diffusion layer 124 is preferred to be adjusted in a range of, for example, 0.5 to 1.0 μm by heat diffusion. When diffused to a specified depth by heat diffusion, it is preferred for the sake of the characteristic that it may contact with the side wall of the gate trench hole 120a as shown in FIG. 3(c).

The N-diffusion layer 124 is necessary for lessening the electric field from the drain of the MOS transistor, preventing short channeling and keeping a specified interval among the trench holes for the gate, source, and drain.

Figure 4A:
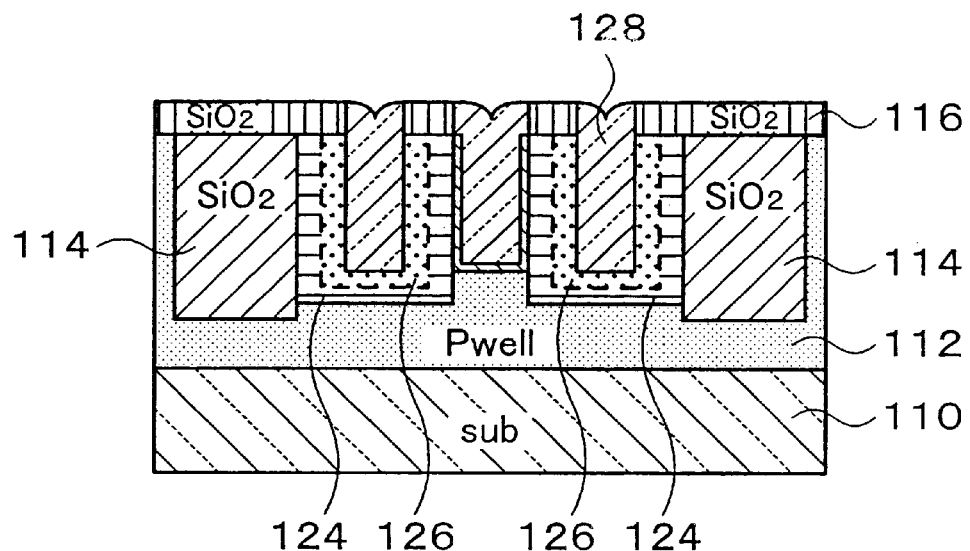
FIG. 4 is a diagram showing a manufacturing method of trench type N channel MOS transistor 100 of SOI structure according to the embodiment.
Figure 5:
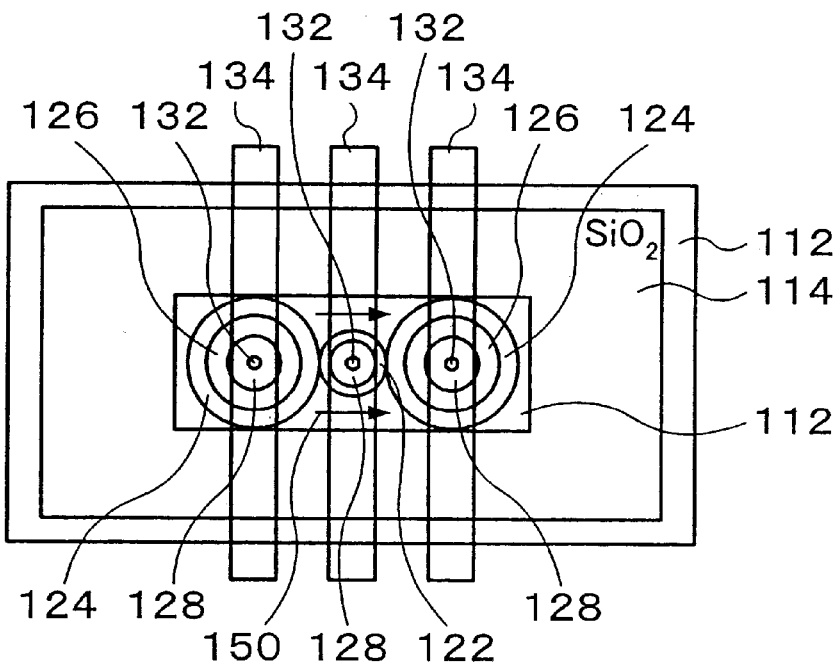
FIG. 5 is a diagram showing the current flowing direction of trench type N channel MOS transistor 100 of SOI structure according to the embodiment.
Figure 6:
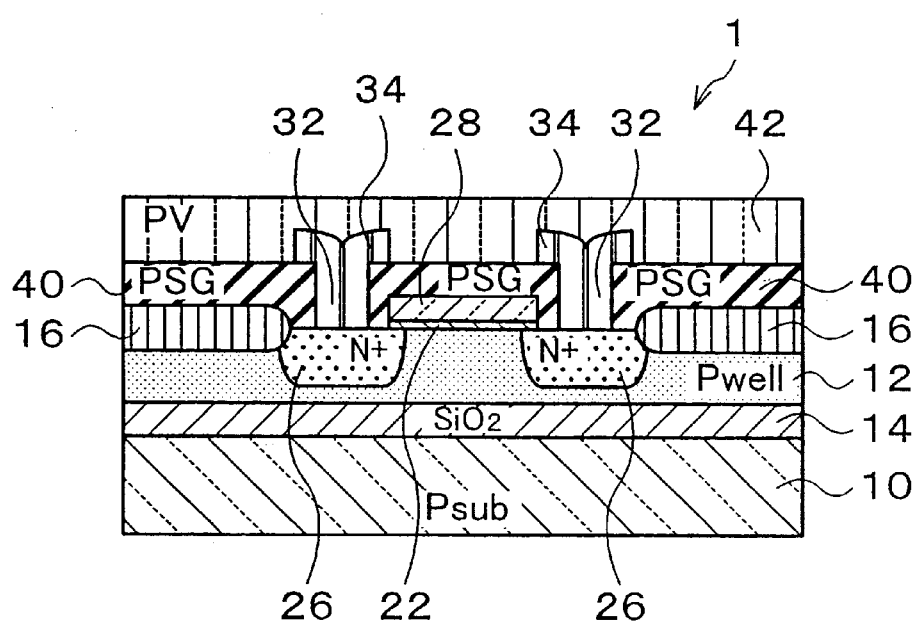
FIG. 6 is a sectional view of MOS transistor of conventional SOI structure.
Figure 7:
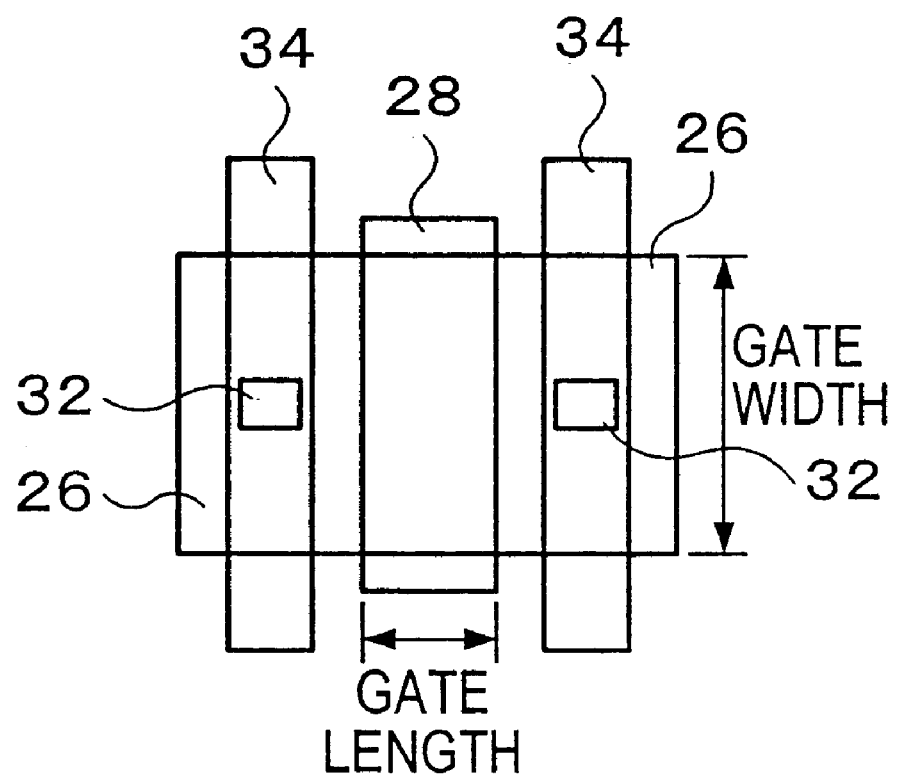
FIG. 7 is a plan of MOS transistor of conventional SOI structure.

The process further goes to FIG. 4(a). In the source and drain trench holes 120b and 120c, further, an N+ diffusion layer 126 is formed. The N+ diffusion layer is the electrodes of the source and drain, and is formed by ion implantation method and heat diffusion same as the N− diffusion layer 124.

The concentration is, for example, about $1 \times 10^{15}$ to $1 \times 10^{16}/cm^2$, and the depth is about 0.1 to 0.3 μm. The uniformity may be further enhanced by the rotary ion implantation method.

Consequently, the trench holes 120a, 120b, and 120c of the gate, source, and drain are filled with a polysilicon electrode 128. As known well, in order to enhance the conductivity, the trench hole is filled with the polysilicon film doped with impurities, and further by etching back by the plasma dry etching, the polysilicon film is removed from other area than the trench hole regions.

The thickness of the polysilicon film is, for example, about 0.3 to 0.5 μm, and it is formed by CVD method. Impurities may be doped by any one of CVD method, ion implantation method, or heat diffusion method. In this embodiment, the CMOS LSI may be formed by ion implantation method.

As the dopant, phosphorus is used in the case of NMOS, or boron in the case of PMOS. The doping dose is a concentration of, for example, about $1 \times 10^{20}/cm^3$. To dope the dopant uniformly in the depth direction, the following method is effective.

First, a thin-polysilicon film of, for example, about 0.1 μm so as not to fill up the trench hole completely is formed in the trench hole. Next, by oblique implantation by ion implantation method, impurities are implanted uniformly in the polysilicon.

Then, a polysilicon film of the remaining thickness is formed by the CVD method, and the trench hole is completely filled with the polysilicon. Further, by heat diffusion at 900 to 1000° C., a polysilicon electrode 128 is completed.

When forming a CMOS, at the time of ion implantation, different impurities are selectively implanted into the N channel MOS region and P channel MOS region, by using the photo resist film as the mask.

Figure 4B:
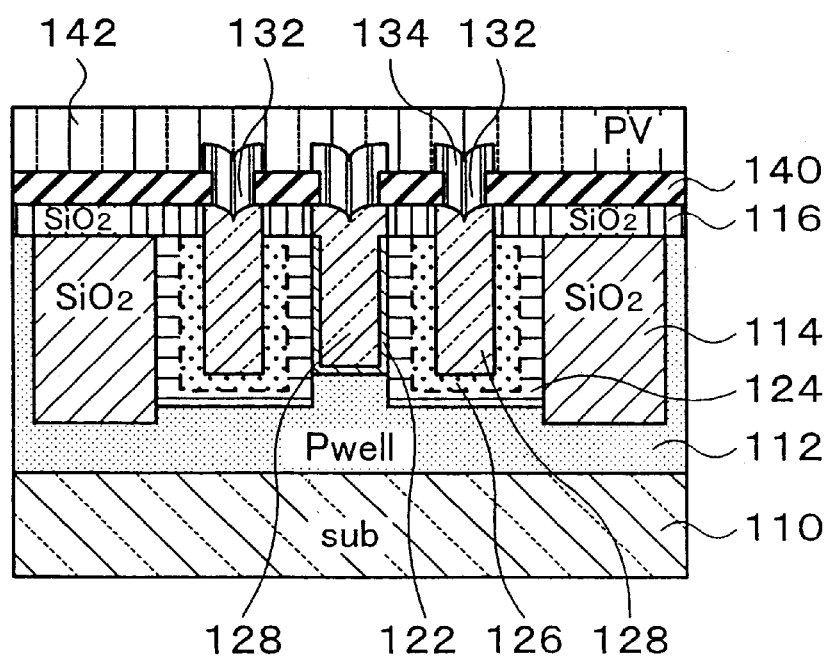

The process goes to FIG. 4(b). On the entire surface, a PSG film 140 in a thickness of, for example, 0.5 to 1.0 μm is formed at a phosphorus concentration of about 12 to 20 wt. %. To enhance the heat fluidity, further, boron or the like may be added at a concentration of, for example, about 5 to 10 wt. %.

Further, a contact hole 132 with an aluminum electrode 134 is formed by photolithography and etching. Then the aluminum is formed in a thickness of, for example, 1 μm by sputtering method. By further patterning the aluminum, an aluminum electrode 134 is formed.

Finally, to protect the element, a PV film 142 is formed on the entire surface in a thickness of, for example, about 1 μm. As the PV film 142, a silicon nitride film or the like by plasma CVD method is used.

In the FT-MOS structure of this embodiment, since each polysilicon electrode 128 is completely buried in the semiconductor substrate, the current path is formed in the bulk of the substrate, and the current flows from the surface into the inside.

Therefore, the gate width gw corresponds to the depth of the gate trench hole 120a (for example, about 5 μm). The gate length gl corresponds to the width of the gate trench hole 120a (for example, about 1 μm).

However, as indicated by two arrows 150 in FIG. 5, since the current flows to both sides of the gate trench hole 120a, the effective gate length corresponds to 2 gl. Hence, in the SOI type MOS element of the embodiment, it is a feature that the current flows along the side wall of the gate trench hole 120a. Hence, the structure composed of the $SiO_2$ film 114 in the trench hole 113 and the FT-MOS is the so-called SOI structure.

Therefore, in the MOS transistor of the embodiment, the parasitic diffusion capacity in the source and drain regions can be reduced same as in the prior art.

Thus, in the SOI type MOS element of the embodiment, a thick $SiO_2$ film 114 is formed in the trench hole 113, and it is used as the insulating film of the SOI structure. As a result, unlike the prior art, it is not required to bury the insulating film completely into the silicon substrate.

The trench holes in the embodiment can be formed by the conventionally established manufacturing technology. It hence solves the biggest problems of silicon crystal defect and price.

As other feature, since the MOS transistor is surrounded by $SiO_2$, the channel region may be disposed closely to the $SiO_2$ film. Hence, same as in the prior art, the channel region can be completely formed as depletion layer.

As known well, the sub-threshold characteristic S is expressed in the following formula:

$$S = \ln 10 \cdot kT/q \cdot (1 + Cd/Cox)$$

where k is Boltzmann's constant, T is ambient temperature, Cd is depletion capacity of channel, Cox is capacity of gate oxide film, and q is electric charge of electrons.

As clear from this formula, the smaller the depletion layer capacity Cd, the smaller is the value of S. When the value of S is smaller, the response of the transistor is excellent, so that a higher speed may be realized.

Herein, preferred embodiments of the SOI type MOS element of the invention and its manufacturing method are described while referring to the accompanying drawings, but the invention is not limited to the illustrated examples alone.

For those skilled in the art, various changes and modifications are possible within the scope of the technical concept described in the claims, which are understood to belong to the technical scope of the invention.

For example, in the embodiment, the N channel type MOS is explained, but the same applies to the P channel type MOS or CMOS type. Besides, the $SiO_2$ film is not limited to the heat oxide film, but may also include, for example, the CVD film. Besides, their laminated films, or laminated films with other CVD film may be also used.

As explained herein, according to the invention, the gate, source, and drain electrodes of the MOS transistor are formed in the trenches in the semiconductor substrate, and the transistor is surrounded by a thick $SiO_2$ film, so that a transistor of stable characteristics is obtained.

In addition, for its manufacture, the conventionally established manufacturing technology can be employed, and the SOI structure of high quality free from crystal defect can be manufactured at high yield and low cost.

By the SOI structure, the parasitic capacity of the diffusion layer and channel portion can be reduced, and a high speed performance is achieved. Further, by the FT-MOS structure, the channel can be formed in the inner direction of the substrate, and the occupied flat surface area is decreased, and the required size is smaller. Hence, an element of higher degree of integration is easily formed.

What is claimed is:

1. A MOS element having a MOS transistor structure comprising:

gate, source and drain electrodes buried in first, second and third trenches formed in a semiconductor substrate, a thick $SiO_2$ film in a fourth trench formed in the semiconductor substrate for surrounding the transistor, and a channel region formed in the semiconductor substrate along the first trench.

2. The MOS element according to claim 1, wherein impurities are preliminarily doped in the fourth trench to prevent inversion of parasitic MOS.

3. The MOS element according to claim 1, wherein impurities are preliminarily doped by ion implantation into the bottom of the first trench to prevent generation of parasitic channel.

4. The MOS element according to claim 1, further comprising an intermediate insulating layer, contact holes, a wiring electrode, and a passivation layer.

* * * * *